United States Patent
Coene (10) Patent No.: US 6,535,151 B2
(45) Date of Patent: Mar. 18, 2003

(54) DEVICE FOR ENCODING N-BIT SOURCE WORDS INTO CORRESPONDING M-BIT CHANNEL WORDS AND DECODING M-BIT CHANNEL WORDS INTO CORRESPONDING N-BIT SOURCE WORDS

(75) Inventor: Willem M.J. Coene, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/102,358

(22) Filed: Mar. 20, 2002

(65) Prior Publication Data

US 2002/0175842 A1 Nov. 28, 2002

Related U.S. Application Data

(63) Continuation of application No. 09/460,940, filed on Dec. 14, 1999, now Pat. No. 6,356,215.

(30) Foreign Application Priority Data

Dec. 21, 1998 (EP) ............................................. 98204356

(51) Int. Cl.[7] ............................. H03M 7/00; H03M 7/20
(52) U.S. Cl. ...................................... 341/102; 341/95
(58) Field of Search ............................. 341/58, 59, 95, 341/102, 107, 50, 51, 57; 375/286; 714/792

(56) References Cited

U.S. PATENT DOCUMENTS

| | | | |
|---|---|---|---|
| 4,337,458 A | 6/1982 | Cohn et al. | |
| 5,438,621 A | 8/1995 | Hornak et al. | |
| 5,477,222 A | 12/1995 | Kahlman et al. | |
| 5,859,601 A | 1/1999 | Moon et al. | |
| 6,175,318 B1 * | 1/2001 | Kahlman et al. | 341/59 |
| 6,225,921 B1 * | 5/2001 | Kahlman et al. | 341/58 |
| 6,232,896 B1 | 5/2001 | Coene et al. | |
| 6,256,994 B1 * | 7/2001 | Kahlman | 341/58 |
| 6,275,175 B1 * | 8/2001 | Kahlman et al. | 341/59 |
| 6,356,215 B1 * | 3/2002 | Coene | 341/102 |

FOREIGN PATENT DOCUMENTS

| | | |
|---|---|---|
| EP | 0758825 A1 | 2/1997 |
| WO | WO9933183 | 7/1999 |
| WO | WO9935747 | 7/1999 |

* cited by examiner

Primary Examiner—Patrick Wamsley
(74) Attorney, Agent, or Firm—Michael E. Belk (57) ABSTRACT

A device is disclosed for encoding a stream of databits of a binary source signal (S) into a stream of databits of a binary channel signal (C), wherein the stream of databits of the source signal is divided into n-bit source words ($x_1$, $x_2$), which device comprises converting means (CM) conceived to convert said n-bit source words into corresponding m-bit channel words ($y_1$, $y_2$, $y_3$) in accordance with a conversion of the Jacoby type, where m and n are integers, with m>n. The device further comprises control means (10) for carrying out DC-control on said binary channel signal by introducing a freedom of choice in the source-to-channel conversion.

Furthermore, a decoding device is disclosed for decoding the channel signal obtained by means of the encoding device.

32 Claims, 5 Drawing Sheets

DEVICE FOR ENCODING N-BIT SOURCE WORDS INTO CORRESPONDING M-BIT CHANNEL WORDS AND DECODING M-BIT CHANNEL WORDS INTO CORRESPONDING N-BIT SOURCE WORDS

This application is a continuation of application Ser. No. 09/460,940, filed Dec. 14, 1999, now U.S. Pat. No. 6,356, 215.

SUMMARY OF THE INVENTION

The invention relates to a device for encoding a stream of databits of a binary source signal into a stream of databits of a binary channel signal, wherein the stream of databits of the source signal is divided into n-bit source words, which device comprises converting means conceived to convert said n-bit source words into corresponding m-bit channel words in accordance with a conversion of the Jacoby type, where m and n are integers, with m>n.

The invention also relates to a method of encoding a stream of databits of a binary source signal into a stream of databits of a binary channel signal, wherein the stream of databits of the source signal is divided into n-bit source words, said source words being converted into corresponding m-bit channel words in accordance with a conversion of the Jacoby type, where m and n are integers, with m>n.

The invention further relates to a binary channel signal comprising a stream of databits, converted from a binary source signal comprising a stream of databits, wherein the stream of databits of the source signal comprises n-bit source words, the channel signal comprising m-bit channel words, each one of said m-bit channel words corresponding to one of said n-bit source words in accordance with a conversion of the Jacoby type, where m and n are integers, with m>n.

The invention further relates to a record carrier comprising a binary channel signal comprising a stream of databits, converted from a binary source signal comprising a stream of databits, wherein the stream of databits of the source signal comprises n-bit source words, the channel signal comprising m-bit channel words, each one of said m-bit channel words corresponding to one of said n-bit source words in accordance with a conversion of the Jacoby type, where m and n are integers, with m>n.

The invention further relates to a device for decoding a stream of databits of a binary channel signal into a stream of databits of a binary source signal, wherein the stream of databits of the channel signal is divided into m-bit channel words, which device comprises deconverting means conceived to deconvert said m-bit channel words into corresponding n-bit source words in accordance with a deconversion of the Jacoby type, where m and n are integers, with m>n.

An encoding device and a decoding device mentioned in the foregoing are known from U.S. Pat. No. 4,337,458 (Jacoby channel code). The document discloses a device for encoding a stream of databits of a binary source signal into a stream of databits of a binary channel signal, satisfying a (1,7) runlength constraint. This means that, in a serial datastream of the channel signal, minimally one 'zero' and maximally seven 'zeroes' are present between two consecutive 'ones' in the channel signal. In this respect it should be noted that, normally, an additional preceding step is applied to the (1,7) constrained sequence, resulting in a runlength-limited sequence with a minimum runlength of 2 and a maximum runlength of 8.

The Jacoby channel code as such allows no DC-control at all. All conversions from source bits to channel bits are unambiguous. DC-control implies the reduction of the power of the channel bit stream near zero frequency. The spectral notch at DC allows retrieval of the threshold level from the detected waveform, which is essential for timing-recovery with the PLL.

It is an object of the invention to provide an improved device for encoding n-bit source words into corresponding m-bit channel words in accordance with a conversion of the Jacoby type, so that DC-control is made possible.

The encoding device in accordance with the invention is characterized in that the device further comprises control means for carrying out DC-control on said binary channel signal by introducing a freedom of choice in the source-to-channel conversion.

The invention is based on the recognition that DC-control will be made possible by introducing an appropriate freedom of choice in the source-to-channel conversion. Therefore, two options in the choice for some predetermined source-to-channel conversions are created. Both options are different in one extra '1' In the channel stream of databits in NRZI-notation, so the difference is one extra transition in the channel stream of databits, which has the effect of transforming the pit-bits into land bits (or marks and non-marks in the case of phase change recording) and vice versa after the extra transition. Due to this extra transition, the so-called running-digital sum (RDS) value can be kept within certain bounds, which is a sufficient condition for the generation of a spectral notch at DC. This kind of DC-control will be referred to as stochastic DC-control. The RDS gives a measure of the low-frequency content as it is defined as the difference between the totals of pit and land lengths in the channel stream of databits.

In the parity preserve channel code, e.g. described in U.S. Pat. No. 5,477,222 (PHN-14448), DC-control is also performed by limiting the RDS within certain bounds. The main difference with the parity preserve principle is that the latter needs extra bits, the so-called parity preserve bits, before the channel encoding operation in order to control the RDS value. In this invention, no extra bits are needed, since the bits that allow control of the RDS value are implicitly present in the source-to-channel conversion with double options. The frequency of occurrence of these DC-control points in the channel bitstream depends on the actual content of the source bitstream, which makes the type of DC-control in this invention to be of a stochastical nature. This invention has as an advantage that the capacity of a record carrier can be enlarged.

The encoding device in accordance with the invention is characterized in that the device further comprises bit-adding means for carrying out additional DC-control.

The encoding device in accordance with the invention is suitable to be included in the encoding arrangement, where merging bits are inserted after every q bits in a serial channel bitstream in order to realize an extra DC-control. This may be suitable if the stochastic DC-control as introduced before is regarded to be insufficient.

The purpose of the bit-adding means is to add bits to the channel bitstream, so as to obtain a precoder output signal in which the power of the channel bitstream near zero frequency is further reduced, improving the DC-control. The added bits that are present in the channel bitstream are usually referred to as merging bits. The precoder output signal is recorded on a record carrier. The addition of an n-bit code word to the consecutive code words allows a change of the sign of the RDS contribution.

The method in accordance with the invention is characterized in that the method further carries out DC-control on the binary channel signal by introducing a freedom of choice in the source-to-channel conversion.

The signal in accordance with the invention is characterized in that, in said binary channel signal, a pair of blocks of p consecutive m-bit channel words, being converted from the same block of p consecutive n-bit source words, is present, the blocks of the pair differing from each other in the bit value at one bit position only in said blocks, p being an integer which is larger than 1.

The record carrier in accordance with the invention is characterized in that, in said binary channel signal, a pair of blocks of p consecutive m-bit channel words, being converted from the same block of p consecutive n-bit source words, is present, the blocks of the pair differing from each other in the bit value at one bit position only in said blocks, p being an integer which is larger than 1.

The decoding device in accordance with the invention is characterized in that said deconverting means are also conceived to deconvert a channel sequence comprising pairs of blocks of p consecutive m-bit channel words into the same blocks of p consecutive n-bit source words, the pairs of blocks of p consecutive m-bit channel words differing from each other in the bit value at one bit position only in said blocks, p being an integer which is larger than 1.

With this device, the binary data signal according to the invention, comprising a stream of databits, can be deconverted into a binary source signal comprising a stream of databits.

BRIEF DESCRIPTION OF THE DRAWINGS

The invention will be further described in the following Figure description in which.

DETAILED DESCRIPTION OF THE INVENTION

Figure 1:
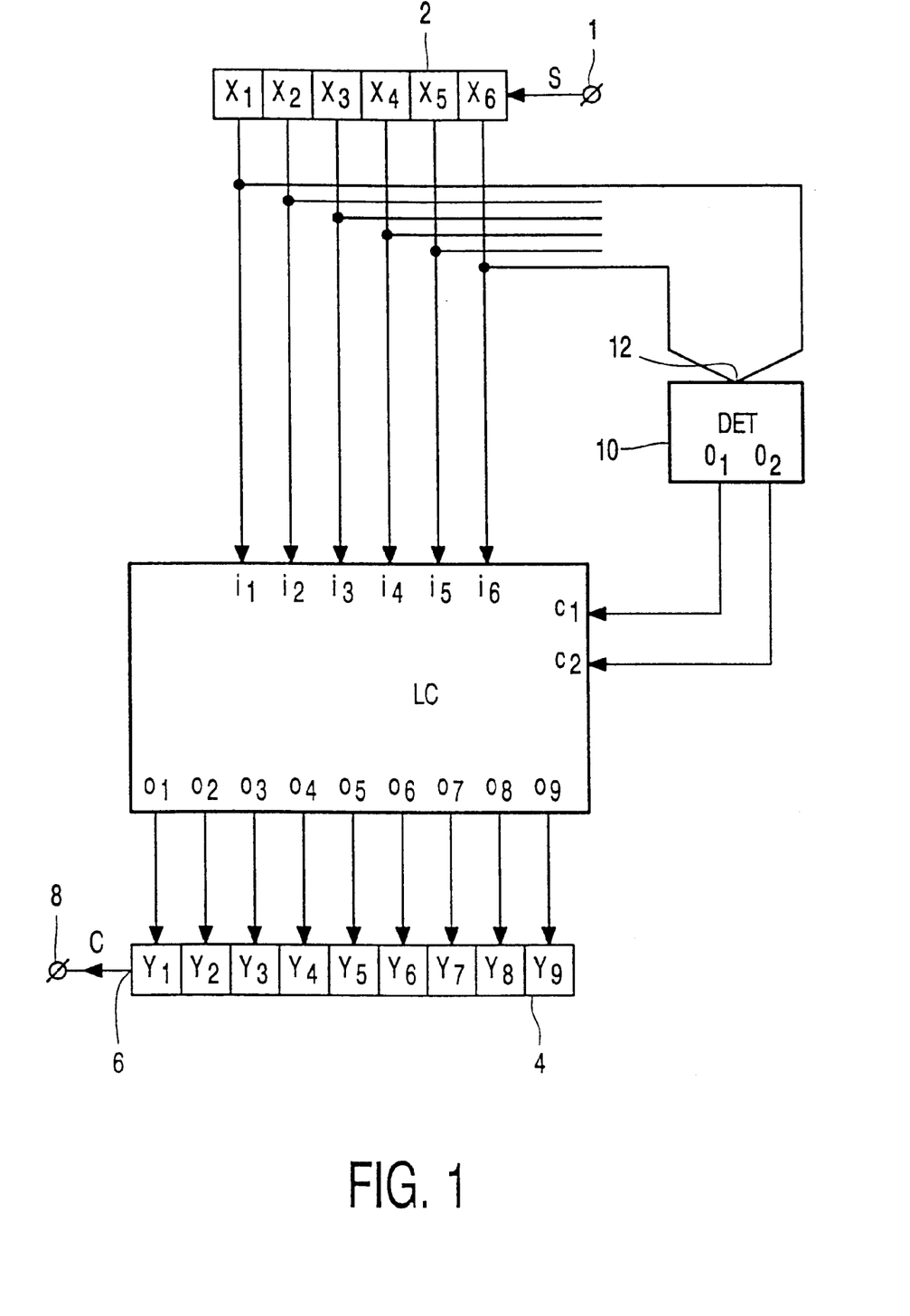
FIG. 1 shows a first embodiment of the encoding device.

FIG. 1 shows an encoding device that is capable of converting 2-bit source words into 3-bit channel words. The device has an input terminal 1 for receiving a stream of databits of a binary source signal S. The terminal 1 is coupled to an input of a shift register 2 having six cells $X_1$ to $X_6$, in the present example, so as to receive six consecutive source bits of the source signal S. The shift register 2 functions as a serial-parallel converter. The outputs of the cells are coupled to corresponding inputs $i_1$ to $i_6$, respectively, of a logic circuit LC, for supplying the logic values $(x_1, \ldots, x_6)$ of the source bits present in the cells. The logic circuit LC forms part of the converting means CM.

The device further includes a second shift register 4 having nine cells $Y_1$ to $Y_9$. The logic circuit LC has nine outputs $o_1$ to $o_9$. These outputs of the logic circuit LC are coupled to corresponding inputs of the nine cells $Y_1$ to $Y_9$, respectively, of the shift register 4. An output 6 of the shift register 4 is coupled to an output terminal 8. The shift register 4 functions as a parallel-serial converter, so as to obtain the binary channel signal C.

Furthermore, a detector unit 10 is available for detecting specific sequences in the serial datastream of the source signal S. To this end, the outputs of the six cells $X_1$ to $X_6$ of the shift register 2 are coupled to corresponding inputs, denoted 12, of the detector unit 10. In the present embodiment, the detector unit 10 has two outputs, denoted $O_1$ and $O_2$, for generating a first and a second control signal, respectively. These outputs are coupled to corresponding control signal inputs $c_1$ and $c_2$, respectively, of the logic circuit LC.

The logic circuit LC functions as follows in response to the control signals applied to its inputs $c_1$ and $c_2$. The logic circuit LC is capable of converting 2-bit source words SW into 3-bit channel words. As an example, the converting means LC is adapted to convert the 2-bit source words SW into 3-bit channel words CW in accordance with the following Table 1:

TABLE 1

| source word | channel word |
|---|---|
| 00 | 101 |
| 01 | 100 |
| 10 | 001 |
| 11 | 010 |

It should be noted here that the first bit in the source word is applied first to the shift register 2 and that the first bit in the channel word is supplied first from the output 6 of the shift register 4.

It should be further noted here that the logic circuit LC converts 2-bit source words stored in the cells $X_1, X_2$ into 3-bit channel words and stores these channel words in the cells $Y_1, Y_2, Y_3$ of the shift register 4, in response to an absence of any control signal at the control signal inputs $c_1$ and $c_2$. Each conversion in this way is followed by a shift over two positions to the left in the shift register 2, and a shift over three positions to the left in the shift register 4. The shift over two positions in the shift register 2 is required to prepare the shift register 2, and thus the converter, for a subsequent conversion. The shift over three positions in the shift register 4 is required to output the generated 3-bit channel word.

The device of FIG. 1 can be used to generate a channel signal C in the form of a (d,k) sequence satisfying the d=1 constraint. This means that at least one 'zero' is present between two subsequent 'ones' in the serial datastream of the channel signal. That is, a concatenation of two or more 'ones' in the channel signal is prohibited.

The unmodified conversion, such as by means of the device of FIG. 1, of combinations of two subsequent 2-bit source words might violate the d=1 constraint. These combinations are the combinations '00 00', which, by unmodified conversion, would lead to the two 3-bit channel words '101 101'; '00 01', which, by unmodified-conversion, would lead to the two 3-bit channel words '101 100'; '10 00', which, by unmodified conversion, would lead to the two 3-bit channel words '001 101' and '10 01', which, by unmodified conversion, would lead to the two 3-bit channel words '001 100'.

The occurrence of such combinations should be detected so that a modified encoding of blocks of two 2-bit source words into blocks of two 3-bit channel words can take place. Therefore, in addition to the 'normal' encoding of 2-bit source words into 3-bit channel words, the device of FIG. 1 is capable of detecting the above identified combinations and of realizing a modified encoding, such that the d=1 constraint in the channel signal is still satisfied.

Since the outputs of the cells $X_1$ to $X_4$ of the shift register 2 are coupled to corresponding inputs of the detector unit 10, this detector unit 10 is capable of detecting the position in the serial bitstream of the source signal, where unmodified encoding of single 2-bit source words in the bitstream into corresponding single 3-bit channel words would lead to a violation of the d=1 constraint in the channel signal C, and is adapted to supply a control signal at its output $O_1$ in response to such a detection.

More specifically, the detector unit 10 detects whether the cells $X_1$ to $X_4$ comprise one of the 4-bit sequences that are given in Table 2, and generates a first control signal at its output $O_1$. As soon as the detector unit 10 detects a combination of two 2-bit source words present in the four cell positions $x_1, x_2, x_3, x_4$, which combination equals one of the combinations given in the left-hand column of Table 2, the logic circuit LC converts the combination in accordance with the modified coding given in Table 2:

TABLE 2

| block of 2 source words | block of 2 channel words/ unmodified coding | block of 2 channel words/ modified coding |
| --- | --- | --- |
| 00 00 | 101 101 | 101 000 |
| 00 01 | 101 100 | 100 000 |
| 10 00 | 001 101 | 001 000 |
| 10 01 | 001 100 | 010 000 |

As can be seen from the Table, unmodified conversion of the single two 2-bit source words leads to a violation of the d=1 constraint, as two 'ones' occur at the boundary between the two channel words obtained. The logic circuit LC is therefore adapted to convert, in a modified coding mode, the blocks of two 2-bit source words given in the left column of the above Table into the blocks of two 3-bit channel words given in the right column in Table 2. As can be seen, no violation of the d=1 constraint occurs anymore. Furthermore, one of the two 3-bit channel words is unequal to one of the four channel words of Table 1, namely the code word 000. The reason for this is that, on the receiver side, a detection of this 3-bit channel word not belonging to the set of four 3-bit channel words of Table 1 is possible, so that a corresponding decoding, which is the inverse of the encoding as defined with reference to Table 2, can be realized.

The block of two 3-bit channel words, obtained by means of the encoding in conformity with Table 2, is supplied by the logic circuit LC to its outputs $O_1$ to $O_6$, which channel words are supplied to the six cells $Y_1$ to $Y_6$ of the shift register 4.

It will further be clear that a conversion of two 2-bit source words into two 3-bit channel words by the converter unit LC is followed by a shift over four positions to the left in the shift register 2 and a shift over six positions to the left in the shift register 4. The shift over four positions in the shift register 2 is required so as to prepare the shift register 2, and thus the converter, for a subsequent conversion. The shift over six positions in the shift register 4 is required to output the two generated 3-bit channel words.

As mentioned hereinbefore, the detector unit 10 is available for detecting specific sequences in the serial datastream of the source signal S. In order to make DC-control possible, the absolute value of the running-digital sum (RDS) value must be limited. Therefore, the detector unit 10 detects whether the cells $X_1$ to $X_6$ comprise one of the 6-bit sequences that are given in Table 3, and generates a second control signal at its output $O_2$.

TABLE 3

| block of 3 source words | block of 3 channel words |
| --- | --- |
| 00 00 01 | 101 000 x00 |
| 00 01 01 | 100 000 x00 |
| 10 00 01 | 001 000 x00 |
| 10 01 01 | 010 000 x00 |

As soon as the detector unit 10 detects a combination of three 2-bit source words present in the six cell positions $x_1, x_2, x_3, x_4, x_5, x_6$, which combination equals one of the combinations given in the left-hand column of Table 3, the logic circuit LC converts the combination in accordance with the coding given in Table 3, where the bit marked 'x' is a DC-control bit and indicates that a choice can be made between the values '0' and '1', depending on the RDS value of the signal and the disparity of the channel bit sequence after DC-control bit 'x' up to the next DC-control bit 'x'.

It should be noted that the bitstream of the channel words is in NRZI (non-return to zero-inverse) notation, which means that a 'one' results in a transition in the write current for recording the channel signal on a record carrier. This record carrier may be a magnetic record carrier or an optical record carrier but is not limited to these two types.

In another embodiment, the detector unit 10 detects whether the cells $X_1$ to $X_6$ comprise one of the 6-bit sequences that are given in Table 4, and generates a second control signal at its output $O_2$. For the block of 3 source words, two possible positions for the DC-control bit 'x' are possible.

TABLE 4

| block of 3 source words | block of 3 channel words |
| --- | --- |
| 00 00 11 | 101 000 0x0 |
| 00 01 11 | 100 000 0x0 |
| 10 00 11 | 001 000 0x0 |
| 10 01 11 | 010 000 0x0 |

As soon as the detector unit 10 detects a combination of three 2-bit source words present in the six cell positions $x_1, x_2, x_3, x_4, x_5, x_6$, which combination equals one of the combinations given in the left-hand column of Table 4, the logic circuit LC again converts the combination in accordance with the coding given in Table 4, in order to control the DC-content of the signal which is present.

It is also obvious to those skilled in the art that, by making a mixture of Table 3 and Table 4, line after line, other tables suited for carrying out DC-control can be constructed. Moreover, it can be shown that one entry in Table 2 can be omitted (e.g. the $4^{th}$ entry), so that it becomes possible to perform stochastic DC-control by creating a freedom of choice in the source-to-channel conversion (e.g. 11 11 being converted into 010 0x0) and by dealing with the d=1 violations due to the omission of one entry in Table 2 by means of the adapted entries of Table 3. In this way, stochastic DC-control can also be performed when a block of 2 consecutive n-bit source words is converted into a block of 2 consecutive m-bit channel words.

Figure 2:
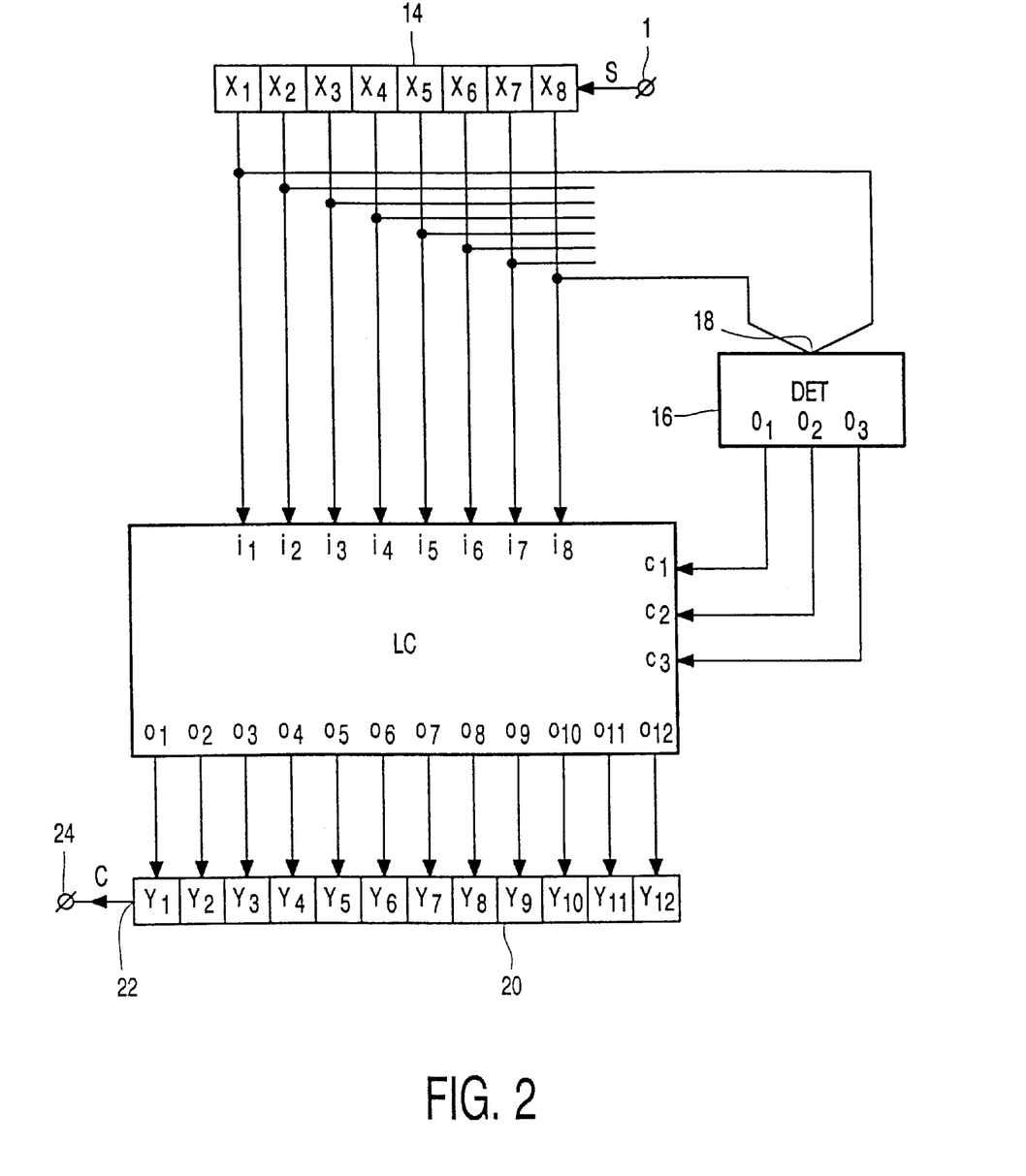
FIG. 2 shows a second embodiment of the encoding device.

FIG. 2 shows another embodiment of the invention, requiring 4 instead of 3 encoding tables, with an encoding device that is capable of converting 2-bit source words into 3-bit channel words. The device has an input terminal 1 for receiving a stream of databits of a binary source signal S. The terminal 1 is coupled to an input of a shift register 14 having eight cells $X_1$ to $X_8$, in the present example, so as to receive eight consecutive source bits of the source signal S. The shift register 14 functions as a serial-parallel converter. The outputs of the cells are coupled to corresponding inputs $i_1$ to $i_8$, respectively, of a logic circuit LC, for supplying the logic values $(x_1, \ldots, x_8)$ of the source bits present in the cells. The logic circuit LC forms part of the converting means CM.

The device further includes a second shift register 20 having twelve cells $Y_1$ to $Y_{12}$. The logic circuit LC has twelve outputs $o_1$ to $o_{12}$. These outputs of the logic circuit LC are coupled to corresponding inputs of the twelve cells $Y_1$ to $Y_{12}$, respectively, of the shift register 20. An output 22 of the shift register 20 is coupled to an output terminal 24. The shift register 4 functions as a parallel-serial converter, so as to obtain the binary channel signal C.

Furthermore, a detector unit 10 is available for detecting specific sequences in the serial datastream of the source signal S. To this end, the outputs of the eight cells $X_1$ to $X_8$ of the shift register 2 are coupled to corresponding inputs, denoted 12, of the detector unit 10. In the present embodiment, the detector unit 10 has three outputs (for Table 2, Table 3 and Table 4), denoted $O_1$, $O_2$ and $O_3$, for generating a first, a second and a third control signal, respectively. These outputs are coupled to corresponding control signal inputs $c_1$, $c_2$ and $c_3$, respectively, of the logic circuit LC. A description of the further functioning of this device can be found in the description of FIG. 1.

As mentioned hereinbefore, the detector unit 10 is available for detecting specific sequences in the serial datastream of the source signal S. In order to make DC-control possible, the running-digital sum (RDS) value must be held within certain bounds. This detector unit is able to detect the same specific sequences as the detector present in the encoding device as described in FIG. 1 and in Tables 1, 2, 3 and 4. In addition, the detector 10 detects whether the cells $X_1$ to $X_8$ comprise one of the 8-bit sequences that are given in Table 5, and generates a third control signal at its output $O_3$.

TABLE 5

| block of 4 source words | block of 4 channel words |
| --- | --- |
| 00 00 10 01 | 101 000 0x0 000 |
| 00 01 10 01 | 100 000 0x0 000 |
| 10 00 10 01 | 001 000 0x0 000 |
| 10 01 10 01 | 010 000 0x0 000 |

As soon as the detector unit 10 detects a combination of four 2-bit source words present in the eight cell positions $x_1,x_2,x_3,x_4,x_5,x_6,x_7,x_8$, which combination equals one of the combinations given in the left-hand column of Table 5, the logic circuit LC converts the combination in accordance with the coding given in Table 5, where the bit marked 'x' indicates that a choice can be made between the values '0' and '1', depending on the RDS value of the signal at that moment.

In another embodiment, the detector unit 10 detects whether the cells $X_1$ to $X_8$ comprise one of the 8-bit sequences that are given in Table 6, and generates a third control signal at its output $O_3$. For the block of 4 source words, three possible positions for the DC-control bit 'x' are possible.

TABLE 6

| block of 4 source words | block of 4 channel words |
| --- | --- |
| 00 00 00 01 | 101 000 x00 000 |
| 00 01 00 01 | 100 000 x00 000 |
| 10 00 00 01 | 001 000 x00 000 |
| 10 01 00 01 | 010 000 x00 000 |

As soon as the detector unit 10 detects a combination of four 2-bit source words present in the eight cell positions $x_1,x_2,x_3,x_4,x_5,x_6,x_7,x_8$, which combination equals one of the combinations given in the left-hand column of Table 6, the logic circuit LC again converts the combination in accordance with the coding given in Table 6, in order to control the DC-content of the signal which is present.

In another embodiment, the detector unit 10 detects whether the cells $X_1$ to $X_8$ comprise one of the 8-bit sequences that are given in Table 7, and generates a third control signal at its output $O_3$.

TABLE 7

| block of 4 source words | block of 4 channel words |
| --- | --- |
| 00 00 10 00 | 101 000 00x 000 |
| 00 01 10 00 | 100 000 00x 000 |
| 10 00 10 00 | 001 000 00x 000 |
| 10 01 10 00 | 010 000 00x 000 |

As soon as the detector unit 10 detects a combination of four 2-bit source words present in the eight cell positions $x_1,x_2,x_3,x_4,x_5,x_6,x_7,x_8$, which combination equals one of the combinations given in the left-hand column of Table 7, the logic circuit LC again converts the combination in accordance with the coding as given in Table 7, in order to control the DC-content of the signal which is present.

It is also obvious to those skilled in the art that, by making a mixture of Table 5, Table 6 and Table 7, line after line, other tables, each with a maximum of 4 lines, suited for carrying out DC-control can be constructed.

As stated before, the devices described above are suitable to be included in the encoding arrangement, where merging bits are inserted after every q bits in a serial channel bitstream in order to realize an extra DC-control. This may be suitable if the stochastic DC-control as introduced before is regarded to be insufficient, depending on the envisaged specific application.

Figure 3:
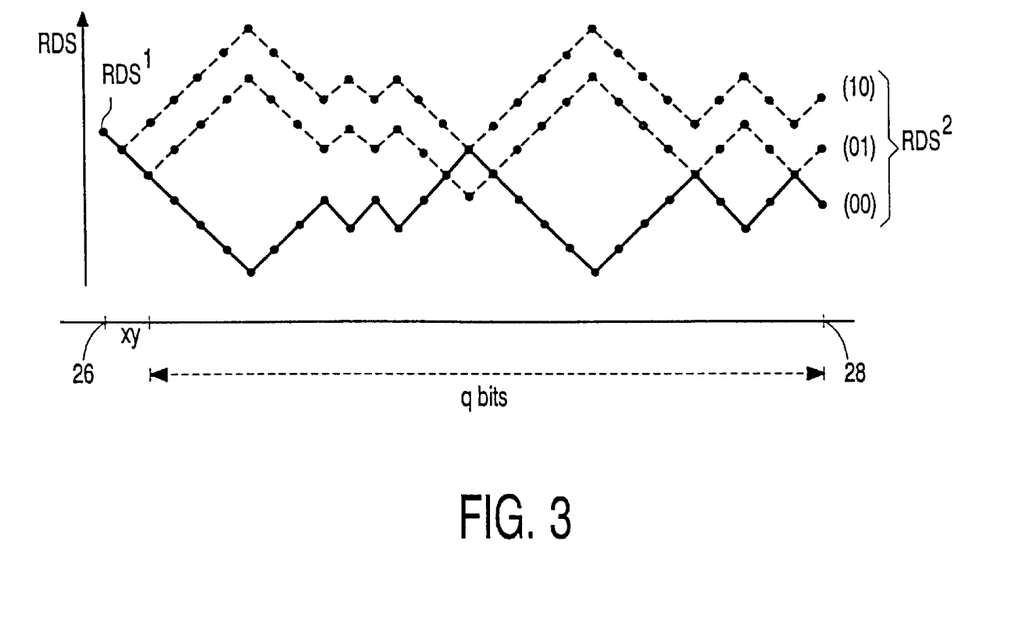
FIG. 3 shows an example of the way in which the value of the RDS can be controlled by inserting merging bits in the channel bitstream.

FIG. 3 shows an example of the way in which the value of the RDS can be controlled by inserting merging bits in the channel bitstream. At a certain position in the channel bitstream 26, the RDS has a certain value $RDS^1$. Two merging bits x and y are then inserted in the bitstream in order to control the value of the RDS. Because the Jacoby code has a d=1 constraint, a choice must be made between the merging bits '00', on the one hand, and '01' or '10', on the other hand. The choice allows a change of the sign of the RDS contribution behind the merging bits. By means of the arrangement shown in FIG. 3, it is possible to keep the DC-content of the channel bitstream close to zero.

At a position in the channel bitstream 28, q bits after position 26, the resulting values $RDS^2$ are shown. It is clear from this example that, by observing the $RDS^2$ values, the proper choice at the position 26 can be made in order to control the DC-content of the channel signal.

Figure 4:
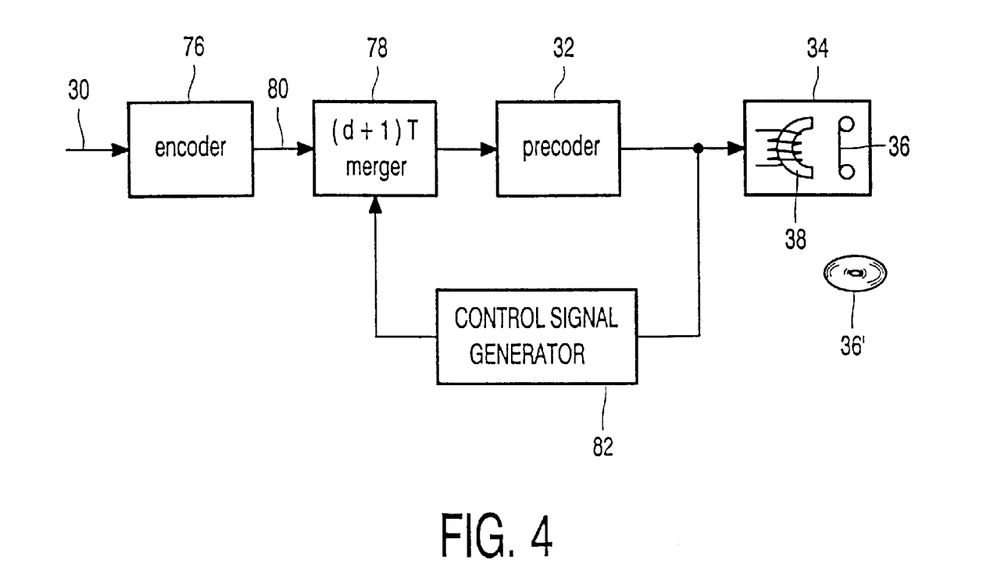
FIG. 4 shows an arrangement for precoding the serial channel signal and recording the precoded signal on a record carrier.

The devices described above are very suitable to be included in the encoding arrangement, where two merging bits are inserted after every q bits in a serial channel bitstream in order to control the DC-content of the channel signal. FIG. 4 shows schematically such an arrangement for precoding the serial channel signal and recording the precoded signal on a record carrier. The source bitstream 30 is applied to an encoder 76. The output signal of the encoder 76, the channel bitstream 80, is supplied to a (d+1)T merger 78 where (due to the fact that in this case d=1) two merging bits are added. The channel bitstream is then supplied to a precoder 32. The output signal of the precoder is applied to a control signal generator 82, which generates the control signal for the (d+1)T merger 78, so as to control which merging bits are to be inserted in the channel bitstream 80 (see FIG. 3). The output signal of the precoder is supplied to a write unit 34 for writing the signal in a track on a record carrier 36. The record carrier 36 may be a magnetic record carrier in a longitudinal or disk form. The record carrier may be alternatively an optical record carrier, such as an optical disk 36'. The write unit 34 comprises a write head 38, which is a magnetic write head, when recording the signal on a magnetic record carrier, or an optical write head, when recording the signal on an optical record carrier.

Figure 5:
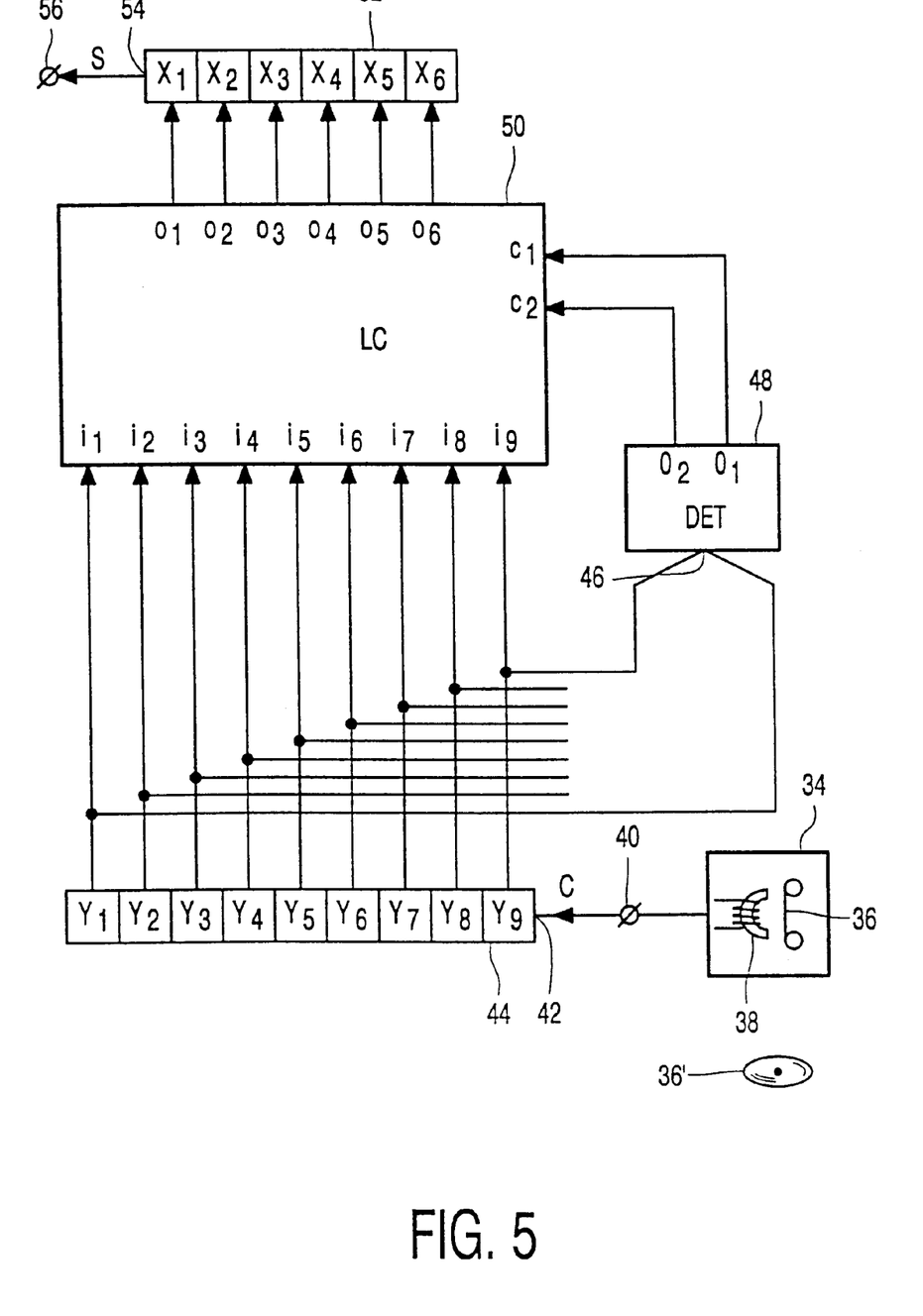
FIG. 5 shows a first embodiment of the decoding device.

FIG. 5 shows an embodiment of a decoding device for decoding the serial datastream obtained by the encoding device of FIG. 1, so as to obtain a binary source signal. The decoding device has an input terminal 40 for receiving the channel signal, which input terminal 40 is coupled to an input 42 of a shift register 44, comprising nine cells $Y_1$ to $Y_9$. The shift register 44 functions as a serial-parallel converter so that blocks of three 3-bit channel words are applied to inputs $i_1$ to $i_9$ of a logic circuit 50. The logic circuit 50 comprises the Tables 1, 2 and 3 or the Tables 1, 2 and 4. Outputs $o_1$ to $o_6$ of the logic circuit 50 are coupled to inputs of cells $X_1$ to $X_6$ of a shift register 52, which has an output 54 coupled to an output terminal 56. A detector circuit 48 is present, having inputs $i_1$ to $i_9$, schematically indicated by the reference numeral 60, coupled to outputs of cells $Y_1$ to $Y_9$ respectively, of the shift register 44, and outputs $O_1$ and $O_2$ coupled to control inputs $c_1$ and $c_2$, respectively, of the logic circuit 50.

In the absence of the control signals, the logic circuit 50 converts the 3-bit channel word stored in the cells $Y_1$, $Y_2$ and $Y_3$ into its corresponding 2-bit source word, as per the conversion Table 1, and supplies the 2-bit source word to the cells $X_1$ and $X_2$. In the presence of the control signal at the input $c_1$, the logic circuit 50 converts the block of two 3-bit channel words stored in the cells $Y_1$ to $Y_6$ into a block of two 2-bit source words, as per the conversion Table 2, and supplies the two 2-bit source words to the cells $X_1$ to $X_4$. In the presence of the control signal at the input $c_2$, the logic circuit 50 converts the block of three 3-bit channel words stored in the cells $Y_1$ to $Y_9$ into a block of three 2-bit source words, as per the conversion Table 3 or conversion Table 4, and supplies the three 2-bit source words to the cells $X_1$ to $X_6$.

In this way, the serial datastream of the channel signal is converted into the serial datastream of the source signal.

Figure 6:
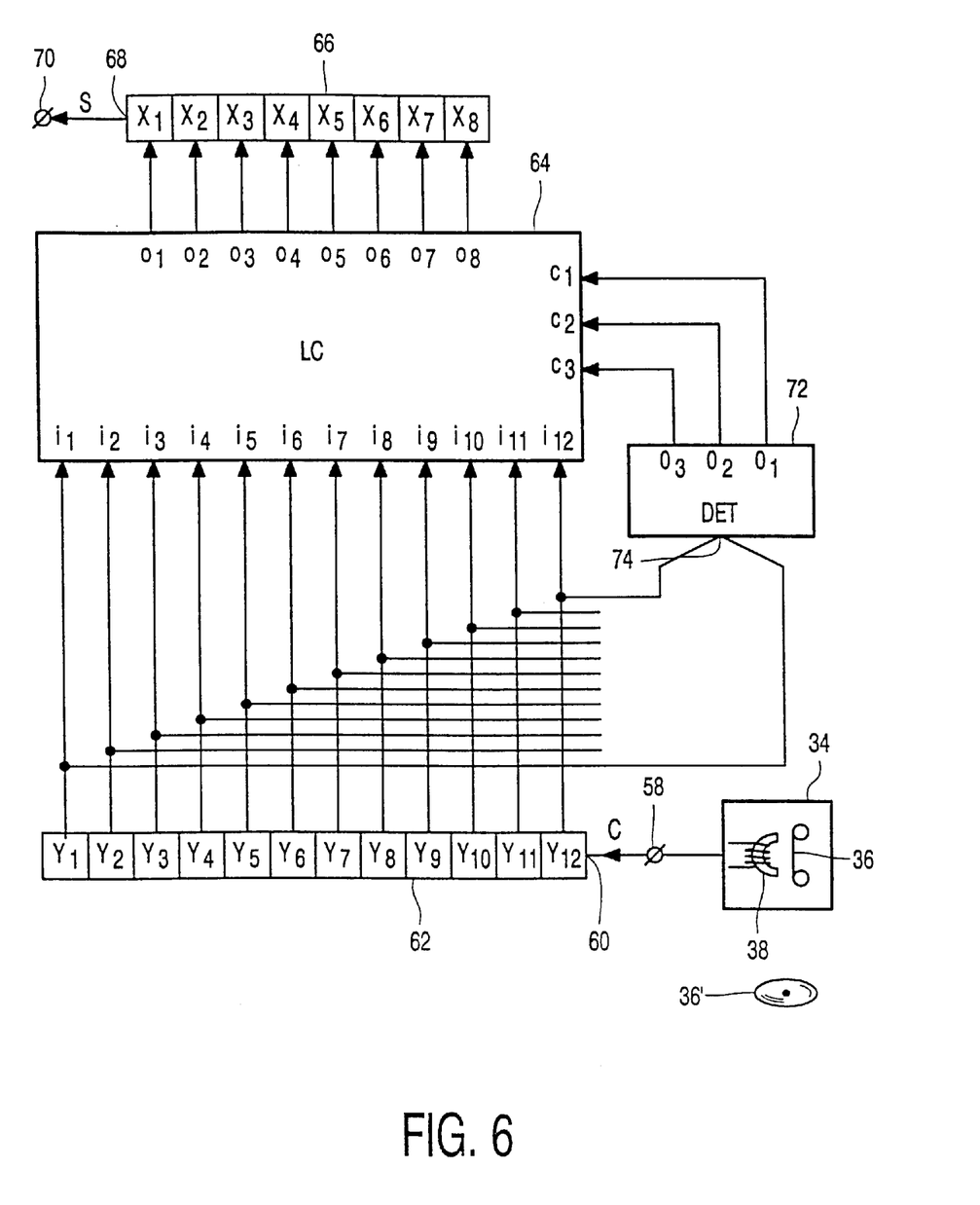
FIG. 6 shows a second embodiment of the decoding device.

The encoded information supplied to the input 40 could have been obtained from reproducing the information from a record carrier, such as a magnetic record carrier 36 or an optical record carrier 36'. To this end, the device in FIG. 4 comprises a read unit 34 for reading the information from a track on the record carrier, where the unit 34 comprises a read/write head 38 for reading the information from said track and/or for writing the information on said track FIG. 6 shows an embodiment of a decoding device for decoding the serial 20 datastream obtained by the encoding device of FIG. 2, so as to obtain a binary source signal. The decoding device has an input terminal 58 for receiving the channel signal, which input terminal 58 is coupled to an input 60 of a shift register 62, comprising twelve cells $Y_1$ to $Y_{12}$. The shift register 62 functions as a serial-parallel converter so that blocks of four 3-bit channel words are applied to inputs $i_1$ to $i_{12}$ of a logic circuit 64. The logic circuit 64 comprises the Tables 1 and 2 and one of the Tables 3 or 4 and one of the Tables 5 or 6 or 7. Outputs $o_1$ to $o_8$ of the logic circuit 64 are coupled to inputs of cells $X_1$ to $X_8$ of a shift register 66, which has an output 68 coupled to an output terminal 70. A detector circuit 72 is present, having inputs $i_1$ to $i_{12}$, schematically indicated by the reference numeral 74, coupled to outputs of cells $Y_1$ to $Y_{12}$ respectively, of the shift register 62, and outputs $O_1$, $O_2$ and $O_3$ coupled to control inputs $c_1$, $c_2$ and $c_3$, respectively, of the logic circuit 64.

In the absence of the control signals, the logic circuit 64 converts the 3-bit channel word stored in the cells $Y_1$, $Y_2$ and $Y_3$ into its corresponding 2-bit source word, as per the conversion Table 1, and supplies the 2-bit source word to the cells $X_1$ and $X_2$. In the presence of the control signal at the input $c_1$, the logic circuit 64 converts the block of two 3-bit channel words stored in the cells $Y_1$ to $Y_6$ into a block of two 2-bit source words, as per the conversion Table 2, and supplies the two 2-bit source words to the cells $X_1$ to $X_4$. In the presence of the control signal at the input $c_2$, the logic circuit 64 converts the block of three 3-bit channel words stored in the cells $Y_1$ to $Y_9$ into a block of three 2-bit source words, as per the conversion Table 3 or conversion Table 4, and supplies the three 2-bit source words to the cells $X_1$ to $X_6$. In the presence of the control signal at the input $c_3$, the logic circuit 64 converts the block of four 3-bit channel words stored in the cells $Y_1$ to $Y_{12}$ into a block of four 2-bit source words, as per the conversion Table 5 or conversion Table 6 or conversion Table 7, and supplies the four 2-bit source words to the cells $X_1$ to $X_8$.

In this way, the serial datastream of the channel signal is converted into the serial datastream of the source signal.

The encoded information supplied to the input 58 could have been obtained from reproducing the information from a record carrier, such as a magnetic record carrier 36 or an optical record carrier 36'. To this end, the device in FIG. 5 comprises a read unit 34 for reading the information from a track on the record carrier, where the unit 34 comprises a read/write head 38 for reading the information from said track and/or for writing the information on said track Whilst the invention has been described with reference to preferred embodiments, it is to be noted that these are non-limitative examples. Thus, various modifications may be apparent to those skilled in the art, without departing from the scope of the invention, as defined in the claims.

The invention also lies in each and every novel feature or combination of features.

What is claimed is:

1. A device for encoding a stream of databits of a binary source signal (S) into a stream of databits of a binary channel signal (C), wherein the stream of databits of the source signal is divided into n-bit source words, which device comprises converting means (LC) conceived to convert said n-bit source words into corresponding in-bit channel words of the binary channel signal in accordance with a conversion of the Jacoby type, where m and n are integers, with m>n, characterized in that the device further comprises control means for carrying out stochastic DC-control on said binary channel signal by introducing a freedom of choice in the source-to-channel conversion, wherein said introducing said freedom of choice limits a running digital sum (RDS) of the binary channel signal.

2. A device as claimed in claim 1, characterized in that said converting means (LC) are conceived to convert a block of p consecutive n-bit source words into a block of p consecutive in-bit channel words, at least one of the bits in said blocks of p consecutive in-bit channel words being either '0' or '1' under the influence of said control means, p being an integer which is larger than 1.

3. A device as claimed in claim 2, characterized in that, for p=3, n=2, m=3, the converting means (LC) are conceived to convert predetermined blocks of three consecutive 2-bit source words into blocks of three consecutive 3-bit channel words in accordance with the following table:

| block of 3 source words | block of 3 channel words |
|---|---|
| 00 00 01 | 101 000 x00 |
| 00 01 01 | 100 000 x00 |
| 10 00 01 | 001 000 x00 |
| 10 01 01 | 010 000 x00 | where the bit marked x may be either '0' or '1' under the influence of said control means.

4. A device as claimed in claim 2, characterized in that, for p=3, n=2, m=3, the converting means (LC) are conceived to convert predetermined blocks of three consecutive 2-bit source words into blocks of three consecutive 3-bit channel words in accordance with the following table:

| block of 3 source words | block of 3 channel words |
|---|---|
| 00 00 11 | 101 000 0x0 |
| 00 01 11 | 100 000 0x0 |
| 10 00 11 | 001 000 0x0 |
| 10 01 11 | 010 000 0x0 | where the bit marked x may be either '0' or '1' under the influence of said control means.

5. A device as claimed in claim 2, characterized in that, for p=4, n=2, m=3, the converting means (LC) are conceived to convert predetermined blocks of four consecutive 2-bit source words into blocks of four consecutive 3-bit channel words in accordance with the following table:

| block of 4 source words | block of 4 channel words |
|---|---|
| 00 00 10 01 | 101 000 0x0 000 |
| 00 01 10 01 | 100 000 0x0 000 |
| 10 00 10 01 | 001 000 0x0 000 |
| 10 01 10 01 | 010 000 0x0 000 | where the bit marked x may be either '0' or '1' under the influence of said control means.

6. A device as claimed in claim 2, characterized in that, for p=4, n=2, m=3, the converting means (LC) are conceived to convert predetermined blocks of four consecutive 2-bit source words into blocks of four consecutive 3-bit channel words in accordance with the following table:

| block of 4 source words | block of 4 channel words |
|---|---|
| 00 00 00 01 | 101 000 x00 000 |
| 00 01 00 01 | 100 000 x00 000 |
| 10 00 00 01 | 001 000 x00 000 |
| 10 01 00 01 | 010 000 x00 000 | where the bit marked x may be either '0' or '1' under the influence of said control means.

7. A device as claimed in claim 2, characterized in that, for p=4, n=2, m=3, the converting means (LC) are conceived to convert predetermined blocks of four consecutive 2-bit source words into blocks of four consecutive 3-bit channel words in accordance with the following table:

| block of 4 source words | block of 4 channel words |
|---|---|
| 00 00 10 00 | 101 000 00x 000 |
| 00 01 10 00 | 100 000 00x 000 |
| 10 00 10 00 | 001 000 00x 000 |
| 10 01 10 00 | 010 000 00x 000 | where the bit marked x may be either '0' or '1' under the influence of said control means.

8. A device as claimed in claim 1, said device further comprising a first shift register whose input is adapted to receive said databits of the source signal and whose outputs are coupled to corresponding inputs of said converting means so to enable the first shift register to effectuate a series-parallel transmission of said databits of the source signal to said converting means.

9. A device as claimed in claim 8, said device further comprising a second shift register whose output is coupled to an output terminal and whose inputs are coupled to corresponding outputs of said converting means so to enable the second shift register to effectuate a parallel-series transmission of said databits of the binary channel signal from said converting means to said output terminal.

10. A device as claimed in claim 1, wherein n=2 and m=3, and said conversion of the Jacoby type comprises converting 2-bit source words into 3-bit channel words in accordance with the following table:

| source word | channel word |
|---|---|
| 00 | 101 |
| 01 | 100 |
| 10 | 001 |
| 11 | 010 | and wherein said conversion of the Jacoby type further comprises converting two consecutive 2-bit source words into two consecutive 3-bit channel words in accordance with the following table:

| block of 2 source words | block of 2 channel words |
|---|---|
| 00 00 | 101 000 |
| 00 01 | 100 000 |

-continued

| block of 2 source words | block of 2 channel words |
|---|---|
| 10 00 | 001 000 |
| 10 01 | 010 000. |

11. A device as claimed in claim 1, wherein said freedom of choice occurs at DC-control points in the binary channel signal, and wherein said occurrence of said DC-control points in the binary channel signal depends on the databits in the source signal.

12. A device as claimed in claim 1, wherein extra parity preserve bits are not utilized in said source-to-channel conversion.

13. A device as claimed in claim 1, wherein at least one zero is present between any two consecutive ones in the databits of the binary channel signal.

14. A device as claimed in claim 1, wherein n=2 and m=3.

15. A device for encoding a stream of databits of a binary source signal (S) into a stream of databits of a binary channel signal (C), wherein the stream of databits of the source signal is divided into n-bit source words, which device comprises converting means (LC) conceived to convert said source words into corresponding in-bit channel words in such a way that the m-bit channel words lack successive bits having a binary value that results in signal transitions, characterized in that the device further comprises control means for carrying out stochastic DC-control on said binary channel signal by introducing a freedom of choice in the source-to-channel conversion, wherein said introducing said freedom of choice limits a running digital sum (RDS) of the binary channel signal.

16. A device as claimed in any one of the preceding claims, characterized in that the device further comprises precoding means for precoding the channel signal so as to obtain a precoded channel signal, and recording means for recording the precoded channel signal onto a record carrier.

17. A device as claimed in claim 16, characterized in that said record carrier an optical record carrier.

18. A device as claimed in claim 16, characterized in that the device further comprises bit-adding means for carrying out additional DC-control.

19. A device as claimed in claim 16, wherein said record carrier is a magnetic record carrier.

20. A method of encoding a stream of databits of a binary source signal (S) into a stream of databits of a binary channel signal (C), wherein the stream of databits of the source signal is divided into n-bit source words, said source words being converted into corresponding m-bit channel words in accordance with a conversion of the Jacoby type, where m and n are integers, with m>n, characterized in that the method further carries out stochastic DC-control on the binary channel signal by introducing a freedom of choice in the source-to-channel conversion, wherein said introducing said freedom of choice limits a running digital sum (RDS) of the binary channel signal.

21. A method as claimed in claim 20, characterized in that a block of p consecutive n-bit source words is converted into a block of p consecutive m-bit channel words, one of the bits in said blocks of p consecutive m-bit channel words being chosen under the influence of said DC-control, p being an integer which is larger than 1.

22. A method as claimed in claim 20 or 21, characterized in that the method further comprises the step of precoding the channel signal (C) so as to obtain a precoded channel signal, and the step of recording the precoded channel signal onto a record carrier.

23. A method as claimed in 22, characterized in that said record carrier is an optical record carrier.

24. A method as claimed in claim 20, characterized in that the method further adds merging bits to said consecutive code words for carrying out additional DC-control.

25. A binary channel signal (C) comprising a stream of databits, converted from a binary source signal (S) comprising a stream of databits, wherein the stream of databits of the source signal comprises n-bit source words, the channel signal comprising in-bit channel words, each one of said in-bit channel words corresponding to one of said n-bit source words in accordance with a conversion of the Jacoby type, where m and n are integers, with m>n, characterized in that, in said binary channel signal, a pair of blocks of p consecutive m-bit channel words, being convened from the same block of p consecutive n-bit source words, is present, the blocks of the pair differing from each other in the bit value at one bit position only in said blocks, p being an integer which is larger than 1, wherein the bit value at the one bit position is determined by a freedom of choice in the source-to-channel conversion, wherein the bit value at the one bit position is adapted to carry out stochastic DC-control on the binary channel signal, and wherein said freedom of choice limits a running digital sum (RDS) of the binary channel signal.

26. A signal as claimed in claim 25, characterized in that the signal further comprises merging bits added to said consecutive code words for carrying out additional DC-control.

27. A record carrier comprising a binary channel signal (C) comprising a stream of databits, converted from a binary source signal (S) comprising a stream of databits, wherein the stream of databits of the source signal comprises n-bit source words, the channel signal comprising m-bit channel words, each one of said m-bit channel words corresponding to one of said n-bit source words in accordance with a conversion of the Jacoby type, where m and n are integers, with m>n, characterized in that, in said binary channel signal, a pair of blocks of p consecutive in-bit channel words, being converted from the same block of p consecutive n-bit source words, is present, the blocks of the pair differing from each other in the bit value at one bit position only in said blocks, p being an integer which is larger than 1, wherein the bit value at the one bit position is determined by a freedom of choice in the source-to-channel conversion, wherein the bit value at the one bit position is adapted to carry out stochastic DC-control on the binary channel signal, and wherein said freedom of choice limits a running digital sum (RDS) of the binary channel signal.

28. A device for decoding a stream of databits of a binary channel signal (C) into a stream of databits of a binary source signal (S), wherein the stream of databits of the channel signal is divided into m-bit channel words, which device comprises deconverting means (LC) conceived to deconvert said m-bit channel words into corresponding n-bit source words in accordance with a deconversion of the Jacoby type, where m and n are integers, with m>n, characterized in that said deconverting means are also conceived to deconvert a channel sequence comprising pairs of blocks of p consecutive m-bit channel words into the same blocks of p consecutive n-bit source words, the pairs of blocks of p consecutive m-bit channel words differing from each other in the bit value at one bit position only in said blocks, p being an integer which is larger than 1, said bit value at the one bit position having a binary value of selected from the group consisting of zero and one, said selected binary value minimizing the running digital sum (RDS) of the binary channel signal.

29. A decoding device as claimed in claim 28, characterized in that said decoding is carried out in accordance with the following table:

| block of 3 channel words | block of 3 source words |
|---|---|
| 101 000 x00 | 00 00 01 |
| 100 000 x00 | 00 01 01 |
| 001 000 x00 | 10 00 01 |
| 010 000 x00 | 10 01 01 | when the bit marked x is '0' and said decoding is carried out in accordance with the following tables:

| source word | channel word |
|---|---|
| 00 | 101 |
| 01 | 100 |
| 10 | 001 |
| 11 | 010 | and

| block of 2 source words | block of 2 channel words |
|---|---|
| 00 00 | 101 000 |
| 00 01 | 100 000 |
| 10 00 | 001 000 |
| 10 01 | 010 000 | when the bit marked x is '1'.

30. A decoding device as claimed in claim 29, characterized in that said decoding is carried out in accordance with the following table:

| block of 3 channel words | block of 3 source words |
|---|---|
| 101 000 0x0 | 00 00 11 |
| 100 000 0x0 | 00 01 11 |
| 001 000 0x0 | 10 00 11 |
| 010 000 0x0 | 10 01 11 | when the bit marked x is '0' and said decoding is carried out in accordance with the following tables:

| source word | channel word |
|---|---|
| 00 | 101 |
| 01 | 100 |
| 10 | 001 |
| 11 | 010 | and

| block of 2 source words | block of 2 channel words |
|---|---|
| 00 00 | 101 000 |
| 00 01 | 100 000 |
| 10 00 | 001 000 |
| 10 01 | 010 000 | when the bit marked x is '1'.

31. A device as claimed in claim 28, wherein at least one zero is present between any two consecutive ones in the databits of the binary channel signal.

32. A device as claimed in claim 28, said device further comprising a detector circuit having outputs respectively coupled to corresponding inputs of the deconverting means, said detector circuit adapted to supply control inputs to the deconverting means, said deconversion being dependent upon said control inputs.

* * * * *